(12) United States Patent
Kanskar (10) Patent No.: US 10,270,224 B2
(45) Date of Patent: Apr. 23, 2019

(54) ANGLED DBR-GRATING LASER/AMPLIFIER WITH ONE OR MORE MODE-HOPPING REGIONS

(71) Applicant: NLIGHT, INC., Vancouver, WA (US)

(72) Inventor: Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/579,109

(22) PCT Filed: Jun. 6, 2016

(86) PCT No.: PCT/US2016/036080
§ 371 (c)(1),
(2) Date: Dec. 1, 2017

(87) PCT Pub. No.: WO2016/197137
PCT Pub. Date: Dec. 8, 2016

(65) Prior Publication Data
US 2018/0175588 A1    Jun. 21, 2018

Related U.S. Application Data

(60) Provisional application No. 62/171,070, filed on Jun. 4, 2015.

(51) Int. Cl.
*H01S 5/125* (2006.01)
*H01S 5/10* (2006.01)
*H01S 5/0625* (2006.01)

(52) U.S. Cl.
CPC ............ *H01S 5/125* (2013.01); *H01S 5/1003* (2013.01); *H01S 5/1007* (2013.01);
(Continued)

(58) Field of Classification Search
CPC ...... H01S 5/125; H01S 5/1085; H01S 5/1064; H01S 5/1003; H01S 2301/163
See application file for complete search history.

(56) References Cited

U.S. PATENT DOCUMENTS 4,856,017 A    8/1989  Ungar
4,942,585 A    7/1990  Ungar
(Continued)

FOREIGN PATENT DOCUMENTS

CN    1411114    4/2003
CN    1415128    4/2003
(Continued)

OTHER PUBLICATIONS

Sarangan et al., "Spectral Properties of Angled-Grating High-Power Semiconductor Lasers," IEEE Journal of Quantum Electronics, 35(8): 1220-1230 (Aug. 1999).*
(Continued)

*Primary Examiner* — Xinning(Tom) Niu
(74) *Attorney, Agent, or Firm* — Klarquist Sparkman, LLP (57) ABSTRACT

A semiconductor laser device is disclosed that includes a laser resonator situated to produce a laser beam, with the laser resonator including an angled distributed Bragg reflector (a-DBR) region including first and second ends defining an a-DBR region length corresponding to a Bragg resonance condition with the first end being uncleaved and including a first mode hop region having a first end optically coupled to the a-DBR region first end and extending a first mode hop region length associated with the a-DBR region length to a second end so as to provide a variable longitudinal mode selection for the laser beam.

31 Claims, 4 Drawing Sheets

(52) U.S. Cl.
CPC .......... *H01S 5/1064* (2013.01); *H01S 5/1085* (2013.01); *H01S 5/06256* (2013.01); *H01S 2301/163* (2013.01)

(56) References Cited

U.S. PATENT DOCUMENTS

| | | |
|---|---|---|
| 4,977,567 A | 12/1990 | Hanke |
| 5,003,550 A | 3/1991 | Welch et al. |
| 5,032,219 A | 7/1991 | Buchmann et al. |
| 5,228,049 A | 7/1993 | Paoli |
| 5,337,328 A | 8/1994 | Lang et al. |
| 5,392,308 A | 2/1995 | Welch et al. |
| 5,499,261 A | 3/1996 | Welch et al. |
| 5,517,517 A | 5/1996 | Liou |
| 5,539,571 A | 7/1996 | Welch et al. |
| 5,602,864 A | 2/1997 | Welch et al. |
| 5,677,920 A | 10/1997 | Waarts et al. |
| 5,794,839 A | 8/1998 | Kimura et al. |
| 5,914,978 A | 6/1999 | Welch et al. |
| 6,014,396 A | 1/2000 | Osinski et al. |
| 6,124,973 A | 9/2000 | Du et al. |
| 6,130,903 A | 10/2000 | Moloney et al. |
| 6,148,013 A | 11/2000 | Geels et al. |
| 6,174,748 B1 | 1/2001 | Jeon et al. |
| 6,181,721 B1 | 1/2001 | Geels et al. |
| 6,192,062 B1 | 2/2001 | Sanchez-Rubio |
| 6,301,037 B1 | 10/2001 | Fischer et al. |
| 6,509,547 B1 | 1/2003 | Bernstein et al. |
| 6,525,872 B1 | 2/2003 | Ziari et al. |
| 6,782,024 B2 | 8/2004 | Schmidt et al. |
| 6,798,815 B2 | 9/2004 | Schmidt et al. |
| 6,810,054 B2 | 10/2004 | Sousa et al. |
| 6,816,531 B1 | 11/2004 | Rossin et al. |
| 6,862,300 B1 | 3/2005 | Traut et al. |
| 6,928,097 B2 | 8/2005 | Chida |
| 7,245,803 B2 | 7/2007 | Gunn, III et al. |
| 7,457,338 B2 | 11/2008 | Mawst et al. |
| 7,602,828 B2 | 9/2009 | Rossin et al. |
| 7,623,555 B2 | 11/2009 | Traut et al. |
| 7,697,589 B2 | 4/2010 | Volodin et al. |
| 7,715,457 B2 | 5/2010 | Schmidt et al. |
| 7,733,932 B2 | 6/2010 | Faybishenko |
| 7,817,693 B2 | 10/2010 | Alahautala et al. |
| 8,111,727 B2 | 2/2012 | Harder et al. |
| 8,437,583 B2 | 5/2013 | Ban |
| 8,442,085 B2 | 5/2013 | Sorimachi et al. |
| 8,615,029 B2 | 12/2013 | Ovtchinnikov et al. |
| 9,166,369 B2 | 10/2015 | Kanskar |
| 9,214,786 B2 | 12/2015 | Hemenway et al. |
| 9,627,852 B2 | 4/2017 | Hemenway et al. |
| 2002/0037021 A1 | 3/2002 | Ohkubo |
| 2002/0105718 A1 | 8/2002 | Bacher et al. |
| 2002/0181525 A1 | 12/2002 | Kasukawa |
| 2003/0057427 A1 | 3/2003 | Chida |
| 2003/0219054 A1 | 11/2003 | Capasso et al. |
| 2005/0013337 A1 | 1/2005 | Jung |
| 2005/0254531 A1* | 11/2005 | Furukawa ............ H01S 5/06256 372/22 |
| 2006/0023173 A1 | 2/2006 | Mooradian et al. |
| 2007/0053397 A1 | 3/2007 | Burckel et al. |
| 2008/0112450 A1 | 5/2008 | Krakowski |
| 2008/0212632 A1 | 9/2008 | Eberhard et al. |
| 2009/0201962 A1 | 8/2009 | Satoh et al. |
| 2009/0225797 A1* | 9/2009 | Kuhnelt ............... H01S 5/02248 372/22 |
| 2009/0245315 A1 | 10/2009 | Faybishenko |
| 2010/0097680 A1 | 4/2010 | Naftali et al. |
| 2011/0299172 A1 | 12/2011 | Mikhailov et al. |
| 2012/0069861 A1 | 3/2012 | Neuberger |
| 2012/0177077 A1 | 7/2012 | Erbert et al. |
| 2013/0044778 A1* | 2/2013 | Gollier ................ H01S 5/06256 372/38.02 |
| 2013/0089115 A1 | 4/2013 | Kanskar |
| 2014/0301421 A1 | 10/2014 | Kanskar |

FOREIGN PATENT DOCUMENTS

| | | |
|---|---|---|
| CN | 1672303 | 9/2005 |
| CN | 101714746 | 5/2010 |
| CN | 101490915 | 9/2010 |
| CN | 101833150 | 9/2010 |
| CN | 102255238 | 11/2011 |
| CN | 102401949 | 4/2012 |
| JP | H0220089 | 1/1990 |
| TW | 200729650 | 8/2007 |
| WO | WO 01/48874 | 7/2001 |
| WO | WO 2011/020923 | 2/2011 |
| WO | WO 2011/142849 | 11/2011 |

OTHER PUBLICATIONS

Zhao et al., "On-chip coherent combining of angled grating diode lasers toward bar-scale single-mode lasers," Optics Express 20(6) :6375-6384 (Mar. 12, 2012).*

Agrawal, "Lateral Analysis of Quasi-Index-Guided Injection Lasers: Transition from Gain to Index Guiding," *Journal of Lightwave Technology*, LT-2(4):537-543 (Aug. 1984).

Bartolo, et al. "Mid-infrared angled-grating distributed feedback laser," *Applied Physics Letters*, 76(22):3164-3166 (May 29, 2000).

Decision of Rejection for from the State Intellectual Property Office of the People's Republic of China for related Application No. 201380077216.1, dated Sep. 5, 2017, 29 pages (w/ English translation).

Demars, et al., "Angled-grating distributed feedback laser with 1 W cw single-mode diffraction-limited output at 980nm," *Lasers and Electro-Optics*, pp. 77-78 (Jun. 1996).

Güther, "Beam propagation in an active planar waveguide with an angled bragg grating," *Journal of Modern Optics*, 45(7):1537-1546 (Jul. 3, 2009).

International Search Report and Written Opinion for International Application No. PCT/US2013/033424, 9 pages, dated Jul. 18, 2013.

International Search Report for International Application No. PCT/US2014/033563, 2 pages, dated Dec. 23, 2014.

International Search Report for International Application No. PCT/US2013/059970, 6 pages, dated Feb. 6, 2014.

International Search Report and Written Opinion for related International Application No. PCT/US2016/036080, 5 pages, dated Sep. 8, 2016.

Kanskar et al., "High Reliability of High Power and High Brightness Diode Lasers," nLight Corporation, 10 pages (Feb. 2014).

Lang, et al., "Theory of Grating-Confined Broad-Area Lasers," *IEEE Journal of Quantum Electronics*, 24(11):2196-2210 (Nov. 1998).

Larsson et al., "Grating Coupled Surface Emitters: Integrated Lasers, Amplifiers, and Beam Shaping Outcouplers," SPIE Conference on Testing, Packaging, and Reliability of Semiconductor Lasers IV, 3626:190-201 (Jan. 1999).

Marciante et al., "Nonlinear Mechanisms of Filamentation in Broad-Area Semiconductor Lasers," *IEEE Journal of Quantum Electronics*, 32(4):590-596 (Apr. 1996).

Mehuys et al., "Self-Stabilized Nonlinear Lateral Modes of Broad Area Lasers," *IEEE Journal of Quantum Electronics*, QE-23(11):1909-1920 (Nov. 1987).

Odriozola et al., "Design of 1060 nm Tapered Lasers with Separate Contact," *Opt. Quant. Electronics*, 40:1123-1127 (Nov. 2008).

Office Action from the State Intellectual Property Office of the People's Republic of China for related Application No. 201480032789. 7, dated Sep. 29, 2016, 15 pages (w/ English translation).

Office Action from the State Intellectual Property Office of the People's Republic of China for related Application No. 201380077216. 1, dated Nov. 1, 2016, 32 pages (w/ English translation).

Office Action from the Taiwan Patent Office for related Application No. 102136953, dated Jan. 28, 2016, 16 pages.

Office Action from the State Intellectual Property Office of the People's Republic of China for related Application No. 201480032789. 7, dated Mar. 8, 2017, 16 pages (w/ English translation).

(56) References Cited

OTHER PUBLICATIONS

Paschke, et al., "High power and high spectral brightness in 1060 nm alpha-dfb lasers with long resonators," *Electronics Letters*, 39(4):369-370 (Feb. 20, 2003).

Paschke, et al., "Properties of ion-implanted high-power angled-grating distributed-feedback lasers," *IEEE Journal of Selected Topics in Quantum Electronics*, 9(5):1172-1178 (Sep./Oct. 2003).

Second Office Action from the State Intellectual Property Office of the People's Republic of China for related Application No. 201380077216.1, dated Apr. 25, 2017, 27 pages (w/ English translation).

Sumpf et al., "High-Brightness Quantum Well Tapered Lasers," *IEEE Journal of Selected Topics in Quantum Electronics*, 15(3):1009-1020 (May/Jun. 2009).

Sumpf et al., "1060 nm DBR Tapered Lasers with 12 W Output Power and a Nearly Diffraction Limited Beam Quality," *Proc. of SPIE*, 7230:72301E1-72301E8 (Feb. 3, 2009).

Third Office Action from the State Intellectual Property Office of the People's Republic of China for related Application No. 201480032789.7, dated Jul. 20, 2017, 13 pages (w/ English translation).

Venus et al., "Spectral stabilization of laser diodes by external Bragg resonator," Venus-SSDLTR, 5 pages. (2004).

Walpole, "Semiconductor Amplifiers and Lasers with Tapered Gain Regions," *Optical and Quantum Electronics*, 28:623-645 (Jun. 1996).

Wenzel et al., "High-brightness diode lasers," *C.R. Physique*, 4:649-661 (Mar. 2003).

Wong et al., "Angled-grating distributed-feedback laser with 1.2 W cw single-mode diffraction-limited output at 1.06µm," Laser and Electro-Optics, pp. 34-35 (May 1998).

Zhao, et al., "Folded cavity angled-grating broad-area lasers," *Optics Express*, 21(20):24087-24092 (Oct. 2013).

Zhu et al., Modal Gain Analysis of Transverse Bragg Resonance Waveguide Lasers With and Without Transverse Defects, IEEE Journal of Quantum Electronics, 43(10):934-940 (Oct. 20017).

Decision of Rejection from the State Intellectual Property Office of the People's Republic of China for related Application No. 201480032789.7, dated Nov. 30, 2017, 12 pages (w/ English translation).

\* cited by examiner

ANGLED DBR-GRATING LASER/AMPLIFIER WITH ONE OR MORE MODE-HOPPING REGIONS

CROSS REFERENCE TO RELATED APPLICATIONS

This is the U.S. National Stage of International Application No. PCT/US2016/036080, filed Jun. 6, 2016, which was published in English under PCT Article 21(2), which in turn claims the benefit of U.S. Provisional Application No. 62/171,070, filed on Jun. 4, 2015. The provisional application is incorporated herein by reference in its entirety.

FIELD

The disclosure pertains to semiconductor lasers using angled distributed Bragg reflectors.

BACKGROUND

High power single mode lasers are typically limited to less than 2 watts of continuous-wave (CW) output power. For example, the previous state-of-the-art has been either ridge waveguide or buried hetero-structure (BH) Fabry-Perot lasers which produce about 1 watt of CW output power. Power scaling such devices has been accomplished using a master oscillator power amplifier (MOPA) configuration. MOPA devices can provide output beams with superior beam quality and several watts of power, though the beam is highly astigmatic. Consequently, using such devices in various applications, such as coupling the light into an optical fiber, requires complicated and impractical optical arrangements. Angled distributed feedback lasers ("α-DFB") have also shown promise in the past as a way to extend single mode operation in semiconductor lasers and amplifiers into a high power regime. Unfortunately, output powers of only about 1 watt or less have been achieved before excessive loss, instability, or beam degradation occurs. Despite concerted research efforts and various advances in semiconductor fabrication and diode laser technology, scaling α-DFB lasers to higher powers has not met with success. Thus, α-DFB technology has largely stagnated and the once promising concept has been left without significant industrial application.

SUMMARY

According to one aspect of the disclosed technology, a semiconductor laser device includes a laser resonator situated to produce a laser beam, the laser resonator including an angled distributed Bragg reflector (a-DBR) region including first and second ends defining an a-DBR region length corresponding to a Bragg resonance condition with the first end being uncleaved, and the laser resonator also including a first mode hop region having a first end optically coupled to the a-DBR region first end and extending a first mode hop region length associated with the a-DBR region length to a second end so as to provide a variable longitudinal mode selection for the laser beam. In representative embodiments, the first mode hop region length is at least $\lambda^2/(4 \cdot n_g \cdot \Delta\lambda)$ and not greater than $\tfrac{2}{5} \cdot L_{GRT}$, where $\lambda$ is the center wavelength of the laser beam, $n_g$ is the group index of refraction of the propagating mode or modes of the laser beam, $\Delta\lambda$ is an allowed shift in the center wavelength $\lambda$, and $L_{GRT}$ is the a-DBR region length. In various embodiments, oscillators and power amplifiers are disclosed.

According to another aspect of the disclosed technology, a semiconductor laser includes a high reflector and partial reflector defining a laser resonator, an intracavity mode filter including an a-DBR extending between opposite ends of the intracavity mode filter at an oblique angle, the intracavity mode filter lithographically spaced apart from the high reflector and partial reflector so as to provide a positional accuracy for opposite ends of the intracavity mode filter, and a longitudinal mode hop region extending from at least one of the opposite ends of the intracavity mode filter.

According to a further aspect of the disclosed technology, forming an a-DBR region of a monolithic laser resonator having first and second opposite ends arranged at an angle with respect to a-DBR grating portions extending between the opposite ends so that at least the first opposite end is lithographically defined, and forming a mode hop region optically coupled to the a-DBR first opposite end, including cleaving the mode hop region to a mode hop region length from the a-DBR first opposite end so that a resonance associated with the a-DBR is provided with a variable longitudinal mode selection. In representative examples, another opposite mode hop region is formed or an opposite gain region is formed.

The foregoing and other objects, features, and advantages of the disclosed technology will become more apparent from the following detailed description, which proceeds with reference to the accompanying figures.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description some-times uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

As used herein, laser beam refers to electromagnetic radiation at wavelengths of between about 100 nm and 10 μm, and typically between about 500 nm and 2 μm. Examples based on available laser diode sources generally are associated with wavelengths of between about 800 nm and 1700 nm. Optical beams and optical elements are described in some examples with respect to one or more axes. Typically, an axis includes one or more straight line segments along which an optical beam propagates or along which one or more optical elements are situated. Such axes can be bent or folded with reflective surfaces, so that axes need not be single straight line segments.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product (corresponding to a product of an angular divergence and a beam dimension) measured along the slow axis is larger than that measured along the fast axis.

In representative examples, single-mode semiconductor laser beam output is scaled to 5 W, 10 W, 15 W, or greater by providing a laser resonator with an angled distributed Bragg reflector ("a-DBR") portion having tightly controlled dimensions with well-defined boundaries at opposite ends, e.g., through semiconductor lithography and epitaxial growth methods, and a mode hop region extending from at least one of the opposite ends. A mode hop region is coupled to one of the well-defined ends of the a-DBR portion and another mode hop region or a gain region (e.g., an oscillator or amplifier gain region) is coupled to the other well-defined end of the a-DBR portion. In some embodiments, by using a mode hop region, tolerances associated with the formation (e.g., by cleaving) of the laser resonator ends and the corresponding cavity length definition do not affect the precise dimensional requirements associated with the a-DBR portion of the laser resonator or impact device output power scalability. The length of the mode hop region can be selected in relation to the cavity length and the a-DBR portion so that a suitable number of longitudinal modes are provided within the spectral bands of the a-DBR and the semiconductor gain material to hop between during variable or high power laser operation.

The a-DBR portions of the laser resonators described herein function similarly to α-DFB lasers. Operation of α-DFB lasers is described in "Spectral Properties of Angled-Grating High-Power Semiconductor Lasers" authored by Sarangan, Wright, Bossert & Marciante (IEE JQE Vol 35, No 8, p 1220 1999), which is incorporated herein by reference. For α-DFBs, a characteristic energy exchange length is defined by the beat pattern formed by forward propagating coupled modes and backward propagating coupled modes in an angled resonator. A significant angle (e.g., 10°-40°) is present between the normals of the parallel facets of the resonator and the Bragg grating. The optical waves associated with the coupled modes propagate through the grating structure from side to side due to Bragg reflection as they propagate along a winding path extending the length of the electrically-pumped cavity. The resonant mode of the α-DFB lies within a band that is dependent on the grating features, including length, pitch, and angle relative to opposite cleaved ends. The phase fronts of incident and reflected waves corresponding to the beat pattern at the opposite ends are carefully phase-matched. However, depending on the wavelength, the phase fronts are often slightly non-parallel and therefore misaligned with respect to the facet plane, as the facet cannot be cleaved precisely or the angle of the facet with respect to the propagation direction of the resonant mode cannot be precisely oriented. Cleaving, dicing, or other similar techniques typically have ±5 μm tolerance. This phase front misalignment results in reflection losses as power couples into higher order and leaky radiation modes, degrading beam characteristics and reducing device efficiency. If the cavity length of the α-DFB is an odd multiple of the energy exchange length, the threshold for laser operation becomes prohibitively high, the resonance condition is not satisfied, and losses are incurred.

By extending one or more mode hop regions from the corresponding ends of an a-DBR portion of a laser resonator, poor or inconsistent device operation and the inability to power scale can be overcome. The angled-grating area of an a-DBR portion can be lithographically patterned with ±0.1 μm accuracy or better, which is greater than fifty times more accurate in defining the resonance condition associated with the a-DBR portion in the laser resonator. By selecting one or more longitudinal modes within the a-DBR band and allowing movement between the one or more longitudinal modes, the mode-hop region can allow for tuning of the resonance of the a-DBR portion and laser resonator so that the laser operates within the narrow-band reflection spectrum that the a-DBR portion provides and within the emission spectrum of the laser gain media.

As explained by Sarangan et al., the effects of a facet end misalignment in an α-DFB can be described in the reflection coefficient at the facet, multiplying the incident field by a phase factor and integrating with the reflected mode, similar to the reflection of a waveguide mode at a tilted facet. This total reflection coefficient can be evaluated as:

$$R_f \propto \frac{1}{2c\mu_0 P} \int_{-w}^{w} |E'_R(x,z) E_L(x,z)| e^{j2k\sin(\theta-\theta_B)x} dx \qquad \text{Eq. 1}$$

where $\theta$ and $\theta_B$ is the angular mismatch at the facet, P is the power incident on the facet, and $\mu_0$ and c are permeability and speed of light in vacuum respectively. Sarangan further defines a cavity resonance equation:

$$[\tfrac{1}{2}(1+\cos(2\alpha_i L))] \times [e^{-2\alpha_i L}] \times [R_f^2 r_{f1} r_{f2}] \times [e^{[(k g/\beta) - j(\beta + \theta(k_x/\beta))]2L}] = 1 \qquad \text{Eq. 2}$$

where $(r_f R_f)^2$ is the power reflection coefficient having a Fresnel reflection coefficient $r_f$ for a plane wave that is reflected from a tilted facet and that is a weaker function of facet tilt angle compared to $R_f$. Thus, at normal incidence, $|R_f|$ corresponds to the mismatch between the field distributions $E_R'(x,0)$ and $E_L(x,0)$ so that as the angular mismatch increases, further attenuation of the incident mode occurs and $R_f$ approaches zero. At the other facet of the α-DFB, $E_L(x,L)$ will reflect and couple into $E_R'(x,L)$. Since $E_L(x,L)$ and $E_R'(x,0)$ are normal to the facets, $E_R(x,L)$ and $E_L'(x,0)$ have large incidence angles, resulting in poor coupling into the reflected modes and reduced resonance so that $E_L'(x,L)$ and $E_R(x,0)$ can be approximated as zero.

As the cavity length of the α-DFB departs from an even multiple of the energy exchange length, the first term in Eq. 2 adjusts towards zero as $E_R(x,L)$ and $E_L'(x,0)$ become non-zero and additional cavity loss is incurred. If the cavity length becomes an odd multiple of $L_{BEAT}$, the cosine term reduces to zero and the laser has a prohibitive threshold condition. The second term represents a longitudinal loss coefficient associated with lateral power loss through the grating. The third term represents the effect of tilted facets and Fresnel reflection as discussed above. The fourth term corresponds to the gain of the semiconductor material of the α-DFB and to the longitudinal mode spectrum associated with a Fabry-Perot like longitudinal resonance within the α-DFB cavity. The value of 'g' in the fourth term corresponds to the threshold gains for the various longitudinal modes supported by the α-DFB.

The power of an output beam produced by the laser resonator having the a-DBR portion, which operates similar to an α-DFB, can be increased to higher power configurations while maintaining the precision necessary for the dimensional features of the a-DBR portion. For example, amplifier or oscillator gain regions can extend from the angled grating portion to allow generation of an output beam with over 15 W of output power. By coupling an a-DBR portion with a mode hop region, a resonance condition for efficient laser operation can be achieved in addition to higher power operation. In some examples, a laser diode output beam can be produced that is spectrally narrow (e.g., less than 1 nm) and single spatial mode. In further examples, folded cavity angled-grating broad area lasers or lasers including a plurality of angled-grating structures also include one or more mode hop regions and well-defined grating boundaries for the angled-grating structures.

Figure 1:
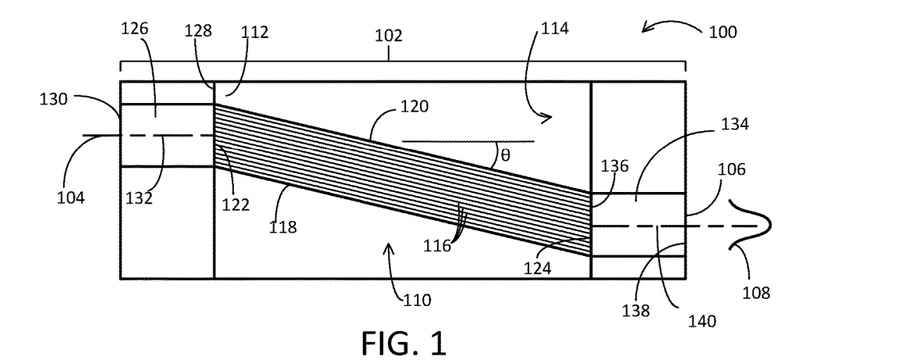
FIG. 1-7 are plan views of examples of semiconductor laser devices.

FIG. 1 shows a semiconductor laser device 100 that includes a laser resonator 102 defined between a high reflector facet 104 and a partial reflector facet 106. The thickness of the waveguides of the various embodiments is typically on the order of the wavelength of light generated (e.g., ~1 μm). Laser devices typically have lengths on the order of millimeters. The laser resonator 102 is typically electrically pumped via electrical contacts (not shown) attached or formed above or below one or more areas of the laser resonator 102. The laser resonator is situated to produce a laser beam 108 that is emitted from the partial reflector facet 106. The laser resonator 102 includes an angled resonator region 110 having a distributed Bragg reflector grating (DBR) extending between opposing ends 112, 114 of the angled resonator region 110 so as to define a grating length $L_{GRT}$. A plurality of grating portions 116 extend between the opposing ends 112, 114 so as to be parallel to opposing sides 118, 120 of the angled resonator region 110. The parallel grating portions 116 are spaced apart by a pitch Λ that is typically on the order of microns or sub-micron and that corresponds with a Bragg condition and a grating bandwidth Δλ. The opposing ends 112, 114 have end surfaces 122, 124 that are parallel and arranged at an angle β (and associated with complement angle θ) to the grating portions 116 and opposing sides 118, 120. The grating length $L_{GRT}$ is carefully selected to match an even integer number of characteristic energy exchange lengths $L_{BEAT}$ associated with the grating geometry of the angled resonator region 110, including the pitch Λ, width, angle θ, etc. The angled resonator region 110 is typically uncleaved and formed via photolithography so as to provide a ±0.5 μm positional accuracy or better for the opposing ends 112, 114 and corresponding end surfaces 122, 124. Because of the positional accuracy provided by the semiconductor growth techniques employed, the angle θ also is provided with an enhanced angular accuracy over facet formation processes such as cleaving and dicing, which have a positional accuracy typically greater than ±2 μm.

A mode hop region 126 extends between opposing ends 128, 130 along an optical axis 132 that is perpendicular to the end surface 122 of the angled resonator region 110 and that is angled with respect to the grating portions 116 at the angle θ. The opposing end 128 of the mode hop region 126 adjoins or otherwise optically coupled to the opposing end 112 of the angled resonator region 110. The opposing end 130 of the mode hop region 126 can be cleaved to define the high reflector facet 104. Another mode hop region 134 extending between opposing ends 136, 138 along an optical axis 140 that can have the same or different length as the mode hop region 134. The optical axis 140 is perpendicular to the end surface 124 of the angled resonator region 110 and is angled with respect to the grating portions 116 at the angle θ. The opposing end 136 of the mode hop region 134 adjoins or is otherwise optically coupled the opposing end 114 of the angled resonator region 110 and the opposing end 138 can be cleaved so as to define the partial reflector facet 106. The length $x_{MH}$ of the mode hop regions 126, 134 can be selected to provide a suitable number of longitudinal modes for mode hopping within the emission bandwidth of the semiconductor laser device 100 and the grating bandwidth of the angled resonator region 110. In representative examples, $x_{MH}$ is selected to correspond to an emission wavelength variation that is associated with a semiconductor fabrication imprecision in defining the grating length $L_{GRT}$.

As stated above, the grating length $L_{GRT}$ is selected to be $k \times L_{BEAT}$ where k is an even integer and can be well-defined through photolithography or other semiconductor epitaxial processing techniques. Since the mode hop region 126 is formed by cleaving or similar process, the length $x_{MH}$ can be defined by $p \times L_{BEAT}$ where p is not an exact integer value so that $p \times L_{GRT} = k \times x_{MH}$. The length $x_{MH}$ can then be selected so as to provide a sufficient number of longitudinal modes for mode hopping corresponding to a shift in $L_{BEAT}$, $|\Delta k| = L_{GRT}/x_{MH}$, up to the maximum corresponding wavelength deviation associated with a residual imprecision in the lithographically defined $L_{GRT}$. Because the maximum wavelength adjustment associated with the shift in $L_{BEAT}$ is half $L_{BEAT}$, a maximum wavelength deviation provided by the mode hop region 126 is associated with a quarter $L_{BEAT}$, corresponding to $\Delta p = \pm \frac{1}{2}$, and $|\Delta k| = L_{GRT}/2x_{MH}$. The wavelength change associated with a mode hop becomes large as $x_{MH}$ decreases so that a selected number of mode hops shifts the lasing wavelength outside the grating or emission bandwidths. For the semiconductor device 100, the total change in wavelength within the grating bandwidth of the angled resonator region 110 is $\Delta \lambda$, $= |\Delta k| \cdot \lambda^2/(2n_g [L_{GRT}+2x_{MH}])$, with λ, equal to the emission wavelength and $n_g$ equal to the group index of refraction of the propagating mode (typically equal to ~4).

In typical examples, the mode hop region 126 is substantially shorter than the grating length $L_{GRT}$, and $L_{GRT}$ is at least as long as $x_{MH}$. Therefore, the length $x_{MH}$ of the mode hop region 126 can be selected to be greater than $\lambda^2/(4n_g \cdot \Delta \lambda)$. For example, if the maximum deviation or shift in the emission wavelength of the laser beam 108 is 0.5 nm near an emission wavelength of 1000 nm, the length of the mode hop region 126 can be selected to be greater than or equal to 114 µm. The length $x_{MH}$ can also be selected so as that a single mode hop does not have a coarse adjustment. In some examples, a practical value can be less than or equal to $\pm\frac{1}{5}L_{BEAT}$, corresponding to $\Delta p=\pm\frac{2}{5}$ and a practical maximum $x_{MH}$ of $\frac{2}{5} \cdot L_{GRT}$. The length $x_{MH}$ for the mode hop region 134 can selected in similar fashion and can be the same or different from the length $x_{MH}$ of the mode hop region 126. The grating length $L_{GRT}$ is typically selected so that the grating bandwidth corresponds to the spectral emission bandwidth. Hence, $\Delta\lambda = \lambda^2/(2n_g L_{GRT})$ and for a 0.5 nm grating bandwidth, $L_{GRT}$ can be greater than or equal to about 250 µm near a 1000 nm emission wavelength. Thus, in some examples, the total cavity length of the laser resonator 102 is $2x_{MH}+(\cos\theta) L_{GRT}$. The mode hop regions 126, 134 can be electrically pumped, together or independently, or one or both can be unpumped, and the angled resonator region 110 is typically electrically pumped. In further examples, the mode hop region 126 can be coupled to the angled resonator region 110 and the mode hop region 134 can be omitted and replaced with a cleaved end to the angled resonator region 110. The length $x_{MH}$ of the mode hop region 126 is selected so as to provide suitable mode hopping to compensate for the imprecision associated with the lithographically defined opposite end 112 and the cleaved end 114.

Figure 2:
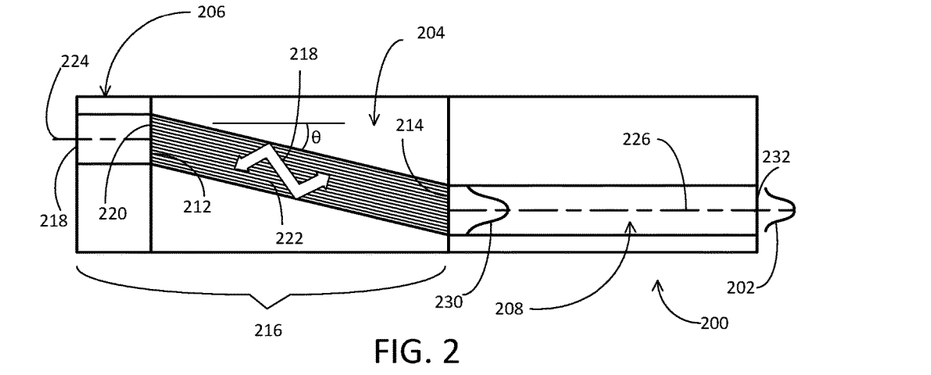

FIG. 2 shows a semiconductor laser device 200 situated to emit an output beam 202 and includes an angled resonator region 204 lithographically defined between a mode hop region 206 and an amplifier region 208. The angled resonator region 204 includes opposing ends 212, 214, with the opposing end 212 optically coupled to or adjoining the mode hop region 206, and the opposing end 214 defining a partial reflector of a laser resonator 216 and optically coupled to or adjoining the amplifier region 208. The mode hop region 206 extends between opposing ends 218, 220 that are parallel to the opposing end 212, with the opposing end 218 defining a high reflector facet for the laser resonator 216. The angled resonator region includes an a-DBR with parallel grating grooves 222 situated at an angle θ with respect to optical axes 224, 226 of the mode hop region 206 and amplifier region 208 respectively. The angle θ is typically greater than a few degrees and less than about 45 degrees.

Thus, the angled resonator region 204 defines an angled distributed Bragg reflector operable to select or filter various transverse and longitudinal modes and to achieve a resonance condition. Through Bragg reflection, a snake-like beam 228 is formed that oscillates between the high reflector facet at opposing end 218 and the partial reflector at the opposing end 214. The amplifier region 208 is situated to receive a portion 230 of the snake-like beam 228 generated by the laser resonator 216 from the opposing end 214 and extends along the optical axis 226 to a cleaved output facet 232. The cleaved output facet 232 is typically anti-reflectivity coated so as to have a reflectivity in the range of 0% to 0.5%. The portion 230 is amplified by the amplifier region 208 before emission as the output beam 202 from the cleaved output facet 232. In representative examples, the semiconductor device 200 is formed monolithically and the length of the amplifier region 208 is greater than the length of the mode hop region 206. The mode hop region 206 can have a length selected based on the analyses above and based on the geometries of the angled resonator region 204 and the amplifier region 208 and can also be determined heuristically.

Figure 3:
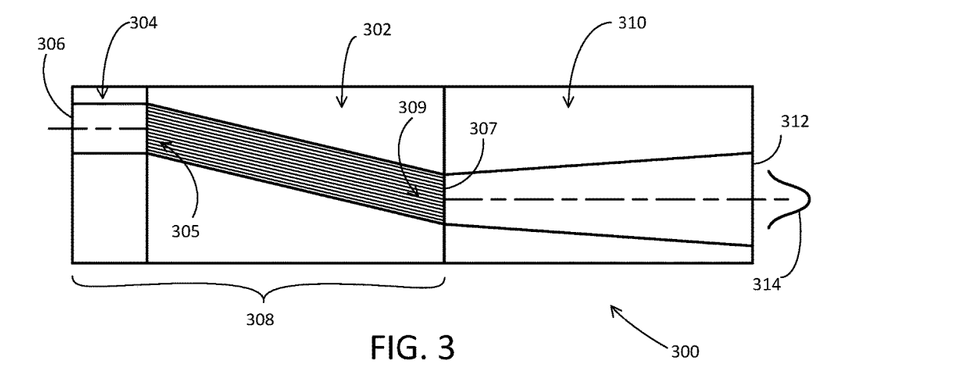

In FIG. 3, a semiconductor laser device 300 is shown which is a variation of the semiconductor laser device 200. The semiconductor device 300 includes an a-DBR region 302 defining a Bragg resonance condition and a mode hop region 304 extending from a first end 305 of the a-DBR region 302 to a high reflector facet 306. An oscillator 308 is formed between the high reflector facet 306 and a partial reflector 307 at an opposite end 309 of the a-DBR region 302. A flared amplifier region 310 extends from the partial reflector 307 and flares outwards as it extends to an output facet 312. In some examples, the flared amplifier region 310 flares so as to accommodate a residual divergence associated with a beam 314 emitted from the partial reflector 306. In further examples, the flared amplifier region 310 flares so as to increase the output power or adjust mode field characteristics of the beam 314. The shape of the flaring of flared amplifier region 310 can vary and include shapes that are symmetrical, non-symmetrical, linear, curved, etc.

Figure 4:
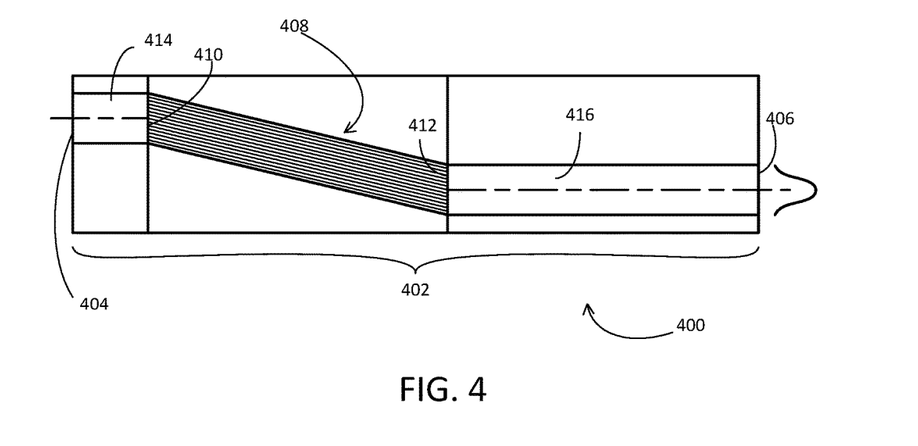

FIG. 4 shows a semiconductor laser device 400 that operates as an oscillator 402. The oscillator 402 is defined between a high reflector facet 404 and a partial reflector facet 406 and generally includes an a-DBR region 408 having opposite ends 410, 412. The a-DBR region 408 is situated between a mode hop region 414 extending from the opposite end 410 of the a-DBR region 408 to the high reflector facet 404 and an oscillator gain region 416 extending from the opposite end 412 to the partial reflector facet 406. The partial reflector facet 406 is typically coated with an anti-reflectivity coating so as to provide a reflectivity in the range of 0.5% to 10% reflectivity. The length of the mode hop region 414 can be defined in relation to the a-DBR region 408 and the length of the oscillator gain region 416 can be defined independent of mode hop constraints.

Figure 5:
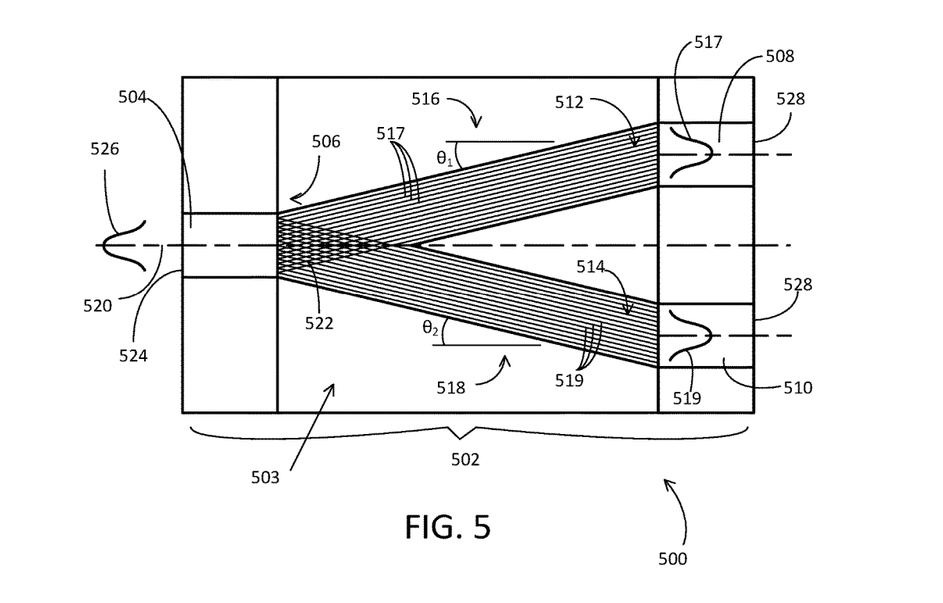

In FIG. 5, a semiconductor laser device 500 includes a laser resonator 502 in the shape of a tuning fork and further includes a split resonator region 503 situated between a mode hop region 504 extending from a base 506 of the split resonator region 503 and a pair of mode hop regions 508, 510 extending from forked ends 512, 514, respectively, of the split resonator region 503. The split resonator region 503 includes a pair of a-DBR regions 516, 518 situated symmetrically about an optical axis 520 associated with the mode hop region 504. A pair of beam portions 517, 519 propagate in the separate mode hop regions 508, 510 and a-DBR regions 516, 518. The split resonator region 503, including the base 506 and forked ends 512, 514, are lithographically defined so as to provide a high degree of accuracy for the geometry of the split resonator 502 and the Bragg resonance associated with the a-DBR regions 516, 518. The a-DBR regions 516, 518 include respective gratings 517, 519 that extend parallel so as to define respective a-DBR region angles $\theta_1$, $\theta_2$. The a-DBR regions 516, 518 form an overlap region 522 at the base 506 that defines a complex grating pattern. The mode hop region 504 is optically coupled to the base 506 and extends a predetermined length to a partial reflector facet 524 of the laser resonator 502 so as to provide an output beam 526. The mode hop regions 508, 510 are optically coupled to the forked ends 512, 514 and extend predetermined lengths to a high reflector facet 528. In representative examples, the predetermined lengths of the mode hop regions 504, 508, 510 are selected so as to provide the split resonator region 503 with an accurate predetermined accuracy associated with an a-DBR resonance and to provide a longitudinal mode hop range associated with a wavelength shift of the resonant mode of the output beam 526. In some examples, the light propagating in the separate channels defined by the mode hop region 508 and a-DBR region 516, and the mode hop region 510 and a-DBR region 518 is coherent. In further examples, the beam portions 517, 519 have separate wavelengths and oscillate between the partial reflector facet 524 and the high reflector facet 528. To produce different wavelengths, the pitches of the gratings 517, 519 are different, and the a-DBR region angles $\theta_1$, $\theta_2$ can be different. The output beam 526 will emit from the mode hop region 504 with two different wavelengths that are incoherently combined. In additional examples, the grating lengths can be different and the high reflector facet 528 can be provided at different distances from the forked ends 512, 514 or does not lie along the same plane for the separate channels.

Figure 6:
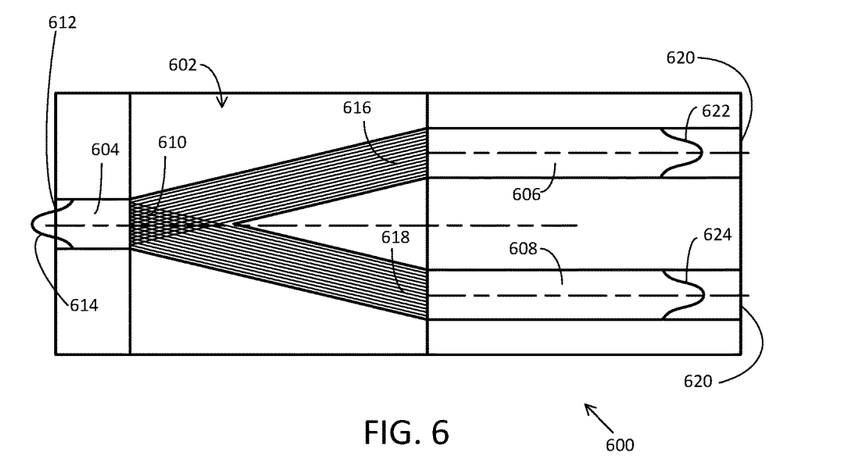

FIG. 6 shows a semiconductor laser device 600 that includes a split resonator region 602 situated between a mode hop region 604 and amplifier gain regions 606, 608. The mode hop region 604 is optically coupled to a base 610 of the split resonator region 602 and extends a predetermined length to a cleaved output facet 612 situated to emit an output beam 614 and having a corresponding selected reflectivity, e.g., 0% to 10%, to provide a corresponding amount of feedback into the split resonator region 602. The amplifier gain regions 606, 608 are optically coupled to split ends 616, 618 of the split resonator region 602 and extend to a high reflector facet 620 situated to reflect beam portions 622, 624 which are double-pass amplified by propagation through the respective amplifier gain regions 606, 608. In some examples, the output beam 614 has an increased power (e.g., twice as much) as compared with similar examples having only a single a-DBR region.

Figure 7:
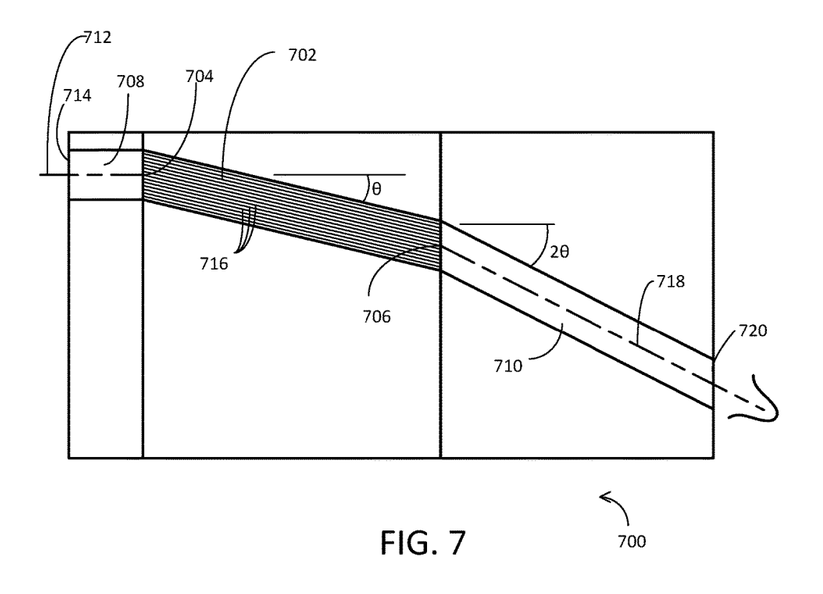

In FIG. 7, a semiconductor laser device 700 includes a lithographically defined a-DBR 702 having opposing ends 704, 706 with the opposing end 704 optically coupled to a mode hop region 708 and the opposing end 706 optically coupled to an angled amplifier region 710. The mode hop region 708 extends along an optical axis 712 to a cleaved high reflector facet 714. The a-DBR 702 includes grating portions 716 that extend parallel to each other and at an angle $\theta$ with respect to the optical axis 712. The angle $\theta$ is typically in the range of a few degrees to 45 degrees, and is generally selected based on the resonance condition of the a-DBR 702. The angled amplifier region 708 extends along an amplifier region axis 718 arranged at an angle 2·$\theta$ to a cleaved output facet 720. The cleaved output facet 720 is typically arranged parallel to the cleaved high reflector facet 714, though other angles are possible. The cleaved output facet 720 is coated with an anti-reflectivity coating, e.g., 0% to 5%.

Figure 8:
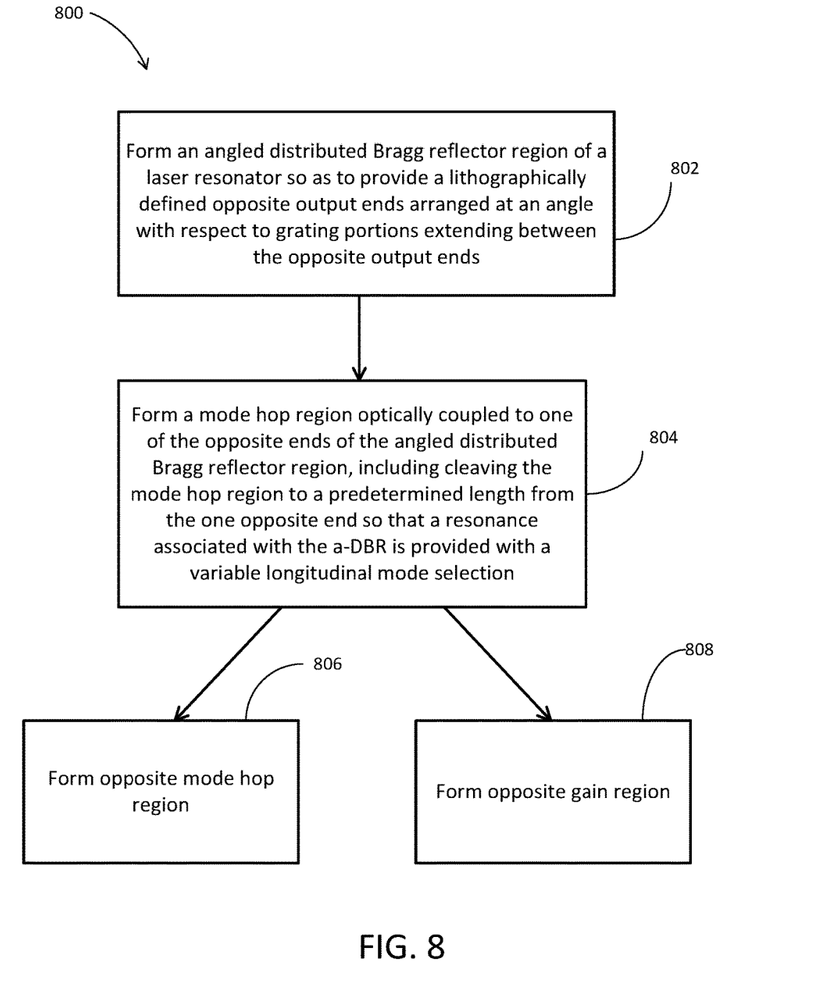
FIG. 8 is a flowchart of a method of fabricating semiconductor laser devices.

FIG. 8 depicts a method 800 of manufacturing a semiconductor laser device that includes an a-DBR and at least one mode hop region. Semiconductor laser devices can be formed using various traditional methods, including MOCVD, MBE, photolithography, etc. At 802, an a-DBR region of a semiconductor laser resonator is formed with first and second opposite ends having well-defined geometry. In some examples, the opposite ends are defined through photolithography, as opposed to cleaving. In further examples, the first opposite end is defined through photolithography or is otherwise uncleaved, and the second opposite end is cleaved. The well-defined geometry of the a-DBR ensures Bragg resonance within the a-DBR. At 804, a mode hop region is formed and optically coupled to the first opposite end. The mode hop region is cleaved to a predetermined length so that a Bragg resonance associated with the a-DBR is provided with a variable longitudinal mode selection.

In some examples, Bragg reflectors or other semiconductor elements can be situated between elements of the semiconductor laser devices, such as between a-DBRs and mode hop regions and between a-DBRs and gain regions, and can effectively increase mode hop region or gain region lengths. In some examples, mode hop regions are electrically pumped separately from a-DBR regions or amplifier or oscillator gain regions. Through separate electrical pumping, the longitudinal mode selection can be varied externally through current and temperature variation. In some examples, semiconductor device output beams are emitted in a single transverse mode and a single longitudinal mode. In other examples, additional modes are present in the output beam. It will be appreciated that in various examples, amplifier gain regions can replace oscillator gain regions and vice versa. In further examples, a lithographically defined In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of devices described herein may be combined in function and use. We therefore claim all that comes within the scope and spirit of the appended claims.

I claim:

1. A semiconductor laser device, comprising:
   a laser resonator situated to produce a laser beam, the laser resonator including:
      an angled distributed Bragg reflector (a-DBR) region including first and second ends defining an a-DBR region length corresponding to a Bragg resonance condition with the first end being uncleaved; and
      a first mode hop region configured to allow mode hopping, the first mode hop region having a first end optically coupled to the a-DBR region first end and extending a first mode hop region length associated with the a-DBR region length to a second end so as to provide a variable longitudinal mode selection for the laser beam;
   wherein first mode hop region second end defines a cleaved facet.

2. The semiconductor laser device of claim 1, wherein the first mode hop region length is at least $\lambda^2/(4 \cdot n_g \cdot \Delta\lambda)$ and not greater than $\frac{2}{5} \cdot L_{GRT}$, where $\lambda$ is the center wavelength of the laser beam, $n_g$ is the group index of refraction of a propagating mode or modes of the laser beam, $\Delta\lambda$ is an allowed shift in the center wavelength $\lambda$, and $L_{GRT}$ is the a-DBR region length.

3. The semiconductor laser device of claim 1, wherein the first mode hop region second end is a partially reflector or a high reflector.

4. The semiconductor laser device of claim 3, wherein the first mode hop region is optically pumped to provide gain for the laser beam.

5. The semiconductor laser device of claim 4, wherein the first mode hop region and the a-DBR region are optically pumped and the first mode hop region is optically pumped separately.

6. The semiconductor laser device of claim 1, further comprising a second mode hop region having first and second ends, the second mode hop region first end optically coupled to the a-DBR region second end and extending to the second mode hop region second end;
   wherein the a-DBR region second end is uncleaved.

7. The semiconductor laser device of claim 6, wherein the first and second mode hop regions include respective optical axes associated with propagation of the laser beam that are parallel.

8. The semiconductor laser device of claim 6, wherein the first mode hop region second end defines a cleaved high reflector of the laser resonator and the second mode hop region second end defines a cleaved partial reflector output of the laser resonator.

9. The semiconductor laser device of claim 6, further comprising:
   a semiconductor amplifier region extending between semiconductor amplifier region first and second ends, with the semiconductor amplifier first end optically coupled to the a-DBR region second end and with the semiconductor amplifier region second end defining a cleaved anti-reflection coated facet situated to amplify and emit laser beam;
   wherein the first mode hop region second end defines a high reflector of the laser resonator.

10. The semiconductor laser device of claim 9, wherein the a-DBR region second end defines a partial reflector output of the laser resonator.

11. The semiconductor laser device of claim 1, wherein the first mode hop region longitudinal mode selection is within a gain bandwidth of the laser resonator and a grating bandwidth of the angled distributed Bragg reflector.

12. The semiconductor laser device of claim 1, wherein the predetermined positional accuracy of the a-DBR region first and second ends is +/−0.1 µm or less.

13. The semiconductor laser device of claim 1, wherein the a-DBR region includes first and second portions having respective first and second ends and situated in a v-shaped arrangement such that the first ends of the first and second portions overlap to form the a-DBR region first end.

14. The semiconductor laser device of claim 13, further comprising a second mode hop region and a third mode hop region having respective first and second ends, with the second mode hop region first end optically coupled to the a-DBR region first portion second end and the third mode hop region first end optically coupled to the a-DBR region second portion second end, and the second ends of the second and third mode hop regions defining a high reflector of the laser resonator.

15. The semiconductor laser device of claim 13, further comprising first and second amplifier regions having respective first and second ends, the first amplifier region first end optically coupled to the a-DBR region first portion second end and the second amplifier region first end optically coupled to the a-DBR region second portion second end, and the second ends of the first and second amplifier regions defining a high reflector.

16. The semiconductor laser device of claim 13, wherein the a-DBR first portion has a first grating pitch and extends at first angle with respect to the first mode hop region and the a-DBR second portion has a second grating pitch different from the first grating pitch and extends at a second angle with respect to the first mode hop region that is different from the first angle.

17. The semiconductor laser device of claim 1, further comprising:
   an amplifier region having first and second ends with the amplifier region first end optically coupled to the a-DBR region second end;
   wherein the a-DBR region includes first and second portions having respective first and second ends and situated in a v-shaped arrangement such that the first ends of the first and second portions overlap to form the a-DBR region second end.

18. The semiconductor laser device of claim 1, further comprising:
   a semiconductor gain region having a first end optically coupled to the a-DBR region second end and extending to a semiconductor gain region second end;
   wherein the a-DBR forms an angle θ with an optical axis of the first mode hop region and an optical axis of the semiconductor gain region forms an angle 2·θ with the first mode hop region optical axis.

19. The semiconductor laser device of claim 1, wherein the a-DBR region first and second ends have end surfaces that are parallel.

20. A semiconductor laser, comprising:
   a high reflector and partial reflector defining a laser resonator;
   an intracavity mode filter including an a-DBR extending between opposite ends of the intracavity mode filter at an oblique angle, the intracavity mode filter lithographically spaced apart from the high reflector and partial reflector so as to provide a positional accuracy for opposite ends of the intracavity mode filter; and
   a longitudinal mode hop region configured to allow mode hopping, the longitudinal mode hop region extending from at least one of the opposite ends of the intracavity mode filter.

21. A method of forming a semiconductor laser, comprising:
   forming an a-DBR region of a monolithic laser resonator having first and second opposite ends arranged at an angle with respect to a-DBR grating portions extending between the opposite ends so that at least the first opposite end is lithographically defined; and
   forming a mode hop region optically coupled to the a-DBR first opposite end, including cleaving the mode hop region to a mode hop region length from the a-DBR first opposite end that is configured to allow mode hopping so that a resonance associated with the a-DBR is provided with a variable longitudinal mode selection.

22. The method of claim 21, further comprising:
   forming a mode hop region optically coupled to the a-DBR second opposite end.

23. The method of claim 21, further comprising:
   forming an amplifier or oscillator gain region optically coupled to the a-DBR second opposite end.

24. A semiconductor laser device, comprising:
   a laser resonator situated to produce a laser beam, the laser resonator including:
      an angled distributed Bragg reflector (a-DBR) region including first and second ends defining an a-DBR region length corresponding to a Bragg resonance condition with the first end being uncleaved; and
      a first mode hop region having a first end optically coupled to the a-DBR region first end and extending a first mode hop region length associated with the a-DBR region length to a second end so as to provide a variable longitudinal mode selection for the laser beam; and
   a second mode hop region having first and second ends, the second mode hop region first end optically coupled to the a-DBR region second end and extending to the second mode hop region second end;
   wherein the a-DBR region second end is uncleaved.

25. The semiconductor laser device of claim 24, wherein the first and second mode hop regions include respective optical axes associated with propagation of the laser beam that are parallel.

26. The semiconductor laser device of claim 24, wherein the first mode hop region second end defines a cleaved high reflector of the laser resonator and the second mode hop region second end defines a cleaved partial reflector output of the laser resonator.

27. The semiconductor laser device of claim 24, further comprising:
a semiconductor amplifier region extending between semiconductor amplifier region first and second ends, with the semiconductor amplifier first end optically coupled to the a-DBR region second end and with the semiconductor amplifier region second end defining a cleaved anti-reflection coated facet situated to amplify and emit laser beam; wherein the first mode hop region second end defines a high reflector of the laser resonator.

28. The semiconductor laser device of claim 27, wherein the a-DBR region second end defines a partial reflector output of the laser resonator.

29. A semiconductor laser device, comprising:
a laser resonator situated to produce a laser beam, the laser resonator including:
an angled distributed Bragg reflector (a-DBR) region including first and second ends defining an a-DBR region length corresponding to a Bragg resonance condition with the first end being uncleaved, wherein the a-DBR region includes first and second portions having respective first and second ends and situated in a v-shaped arrangement such that the first ends of the first and second portions overlap to form the a-DBR region first end; and
a first mode hop region having a first end optically coupled to the a-DBR region first end and extending a first mode hop region length associated with the a-DBR region length to a second end so as to provide a variable longitudinal mode selection for the laser beam; and
a second mode hop region and a third mode hop region having respective first and second ends, with the second mode hop region first end optically coupled to the a-DBR region first portion second end and the third mode hop region first end optically coupled to the a-DBR region second portion second end, and the second ends of the second and third mode hop regions defining a high reflector of the laser resonator.

30. A semiconductor laser device, comprising:
a laser resonator situated to produce a laser beam, the laser resonator including:
an angled distributed Bragg reflector (a-DBR) region including first and second ends defining an a-DBR region length corresponding to a Bragg resonance condition with the first end being uncleaved, wherein the a-DBR region includes first and second portions having respective first and second ends and situated in a v-shaped arrangement such that the first ends of the first and second portions overlap to form the a-DBR region first end; and
a first mode hop region having a first end optically coupled to the a-DBR region first end and extending a first mode hop region length associated with the a-DBR region length to a second end so as to provide a variable longitudinal mode selection for the laser beam;
wherein the a-DBR first portion has a first grating pitch and extends at first angle with respect to the first mode hop region and the a-DBR second portion has a second grating pitch different from the first grating pitch and extends at a second angle with respect to the first mode hop region that is different from the first angle.

31. A method of forming a semiconductor laser, comprising: forming an a-DBR region of a monolithic laser resonator having first and second opposite ends arranged at an angle with respect to a-DBR grating portions extending between the opposite ends so that at least the first opposite end is lithographically defined;
forming a mode hop region optically coupled to the a-DBR first opposite end, including cleaving the mode hop region to a mode hop region length from the a-DBR first opposite end so that a resonance associated with the a-DBR is provided with a variable longitudinal mode selection; and
forming a mode hop region optically coupled to the a-DBR second opposite end.

* * * * *